(12) United States Patent
Sunayama et al.

(10) Patent No.: US 8,003,527 B2
(45) Date of Patent: Aug. 23, 2011

(54) MANUFACTURING METHOD OF SEMICONDUCTOR DEVICE

(75) Inventors: Michie Sunayama, Yokohama (JP); Noriyoshi Shimizu, Bunkyou (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/843,356

(22) Filed: Jul. 26, 2010

(65) Prior Publication Data

US 2011/0034026 A1 Feb. 10, 2011

(30) Foreign Application Priority Data

Aug. 6, 2009 (JP) .................................. 2009-183147

(51) Int. Cl.
*H01L 21/4763* (2006.01)
*H01L 21/44* (2006.01)

(52) U.S. Cl. ........ 438/653; 438/622; 438/627; 438/631; 438/637; 438/643; 257/E21.582; 257/E21.584; 257/E21.585; 257/E21.591

(58) Field of Classification Search ........... 257/E21.582, 257/E21.584, E21.585, E21.591
See application file for complete search history.

(56) References Cited

U.S. PATENT DOCUMENTS

| | | | |
|---|---|---|---|
| 6,111,318 A | 8/2000 | Hoshino | |
| 7,545,040 B2 | 6/2009 | Ueki et al. | |
| 7,833,901 B2 * | 11/2010 | Ohto et al. | 438/637 |
| 2003/0155655 A1 * | 8/2003 | Fitzsimmons et al. | 257/774 |
| 2003/0217462 A1 * | 11/2003 | Wang et al. | 29/846 |
| 2006/0113685 A1 | 6/2006 | Ueki et al. | |
| 2008/0157378 A1 * | 7/2008 | Lee | 257/751 |
| 2009/0061590 A1 * | 3/2009 | Hwang | 438/401 |
| 2009/0203208 A1 | 8/2009 | Ueki et al. | |

FOREIGN PATENT DOCUMENTS

| | | |
|---|---|---|
| AU | 2003266560 A1 | 6/2004 |
| JP | 10-209156 A | 8/1998 |
| JP | 2006-080234 A | 3/2006 |
| WO | 2004/053971 A1 | 6/2004 |

OTHER PUBLICATIONS

A. Isobayashi et al., "Thermally Robust Cu Interconnects with Cu-Ag Alloy for sub 45nm Node", IEEE IEDM 04, Apr. 2004, pp. 953-956, cited in spec.
H. Kudo et al., "Further Enhancement of Electro-migration Resistance by Combination of Self-aligned Barrier and Copper Wiring Encapsulation Techniques for 32-nm Nodes and Beyond", IITC Jun. 2, 2008, pp. 117-119, cited in spec.
M. Haneda et al., "Self-Restored Barrier Using Cu-Mn Alloy", AMC Oct. 9, 2007, pp. 27-28, cited in spec.

* cited by examiner

*Primary Examiner* — Mohsen Ahmadi
(74) *Attorney, Agent, or Firm* — Westerman, Hattori, Daniels & Adrian, LLP

(57) ABSTRACT

A semiconductor device manufacturing method includes forming an interlayer dielectric film above a semiconductor substrate; forming a first wiring trench with a first width and a second wiring trench with a second width that is larger than the first width inr the interlayer dielectric film; forming a first seed layer that includes a first additional element in the first wiring trench and the second wiring trench; forming a first copper layer over the first seed layer; removing the first copper layer and the first seed layer in the second wiring trench while leaving the first copper layer and the first seed layer in the first wiring trench; forming a second seed layer in the second wiring trench after removing the first copper layer and the first seed layer in the second wiring trench; and forming a second copper layer over the second seed layer.

15 Claims, 12 Drawing Sheets

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2009-183147 filed on Aug. 6, 2009, the entire contents of which are incorporated herein by reference.

FIELD

The present disclosure generally relates to a manufacturing method of a semiconductor device.

BACKGROUND

Miniaturization of a semiconductor integrated circuit has been advanced according to scaling rules, and a wiring has been miniaturized along with elements of MOS transistors etc. A copper wiring with lower resistance has become a mainstream replacing an aluminum wiring. Patterning copper wiring with high accuracy is difficult. Thus, a damascene wiring is employed in which a recessed portion is formed in an insulating film to bury a wiring. Copper diffusion in an insulating film deteriorates insulating characteristics. Hence, a configuration is employed in which a copper wiring is wrapped, for example, by a barrier metal film or an insulating copper diffusion preventing film. In many cases, a copper wiring layer is formed by plating. A recessed portion for a wiring is formed over an interlayer dielectric film and a barrier metal film, a plating seed layer is formed by sputtering, and a copper layer is formed over the seed layer by electrolytic plating. The barrier metal film has a function to barrier against diffusion of copper atoms from the copper layer, and is formed, for example, with TiN, Ta, Ta/TaN or Ti. The seed layer functions as an electrode for electrolytic plating and as a seed for plating film formation, and formed with copper or a copper alloy. The barrier metal film and the seed layer formed by sputtering are formed over the interlayer dielectric film as well. The plating layer is formed over the seed layer. Unnecessary metal layers over the interlayer dielectric film are removed by chemical mechanical polishing (CMP) and a SiC or SiN insulating copper diffusion preventing film is deposited so as to cover the copper wiring and the interlayer dielectric film. In this manner, sides and a lower surface of the copper wiring formed as described above are covered by the seed layer and the barrier metal film, and the upper surface is covered by an insulating copper diffusion preventing film.

A melting point of copper is higher than that of aluminum. Thus, copper is an element in which migration is difficult to occur. However, electro migration (EM) may not be ignored in minute wirings (thin width wiring, narrow width wiring). Stress migration (SM) occurs in a large-width wiring (wide wiring). Suppressing migration, for example, by adding another element to copper to make a copper alloy has been studied.

According to Japanese Laid-open Patent No. H10-209156, when Cu—Ta, to which Ta of 0.5 wt. % is added, is heat-treated in an H reductive atmosphere, Ta is precipitated at the Cu grain boundary and suppresses the grain boundary diffusion. Accordingly, a void is hardly created, and the EM resistance is enhanced.

According to WO 2004/53971, an example is introduced in which a countermeasure for EM resistance and SM resistance is applied. In the example, additional elements in the copper alloy seed layer is diffused into a copper layer by heat treatment to form a copper alloy after forming a copper wiring film by using a copper alloy (Cu—Sn etc.) seed layer. When a copper alloy seed layer in which the additional elements that remain in crystal grains increases resistivity of a copper alloy wiring is formed by sputtering, the copper alloy seed layer deposited at a bottom of the wiring trench becomes thinner in a thin-width wiring compared with that in a large-width wiring. As a result, resistivity of the Cu wiring becomes low and resistivity of the Cu wirings varies depending on the wiring width. According to the embodiment, a method to suppress Cu migration is proposed. In the method, for example, additional elements such as Ti, Zn, Hf, Cr, Co, Al, Sn, Ni, Mg, and Ag are diffused from above the copper wiring film into the copper layer to Cu grain boundary and the vicinity that become SM and EM diffusion routes, thereby suppressing Cu migration. Oxidization of copper may be suppressed when stable metal oxide is formed by the additional elements even if the copper layer is exposed to oxidized species.

According to Japanese Laid-open Patent No. 2006-80234, a Cu alloy seed layer is formed such that the film thickness of sidewall portions and the film thickness of the bottom portions of the wiring trenches for a thin-width wiring and for a large-width wiring are substantially the same. A Cu layer is deposited over the seed layer by electroplating and annealed to form a wiring in which a ratio of an additional element decreases as the wiring trench becomes wider. The seed layer is formed, for example, by sputtering or CVD. However, the disclosure does not describe a specific film formation parameter that allows to control and adjust formation of a seed layer with substantially uniform film thickness. The additional element of the seed layer is assumed to be diffused typically in the copper layer. However, the disclosure does not describe how the additional element of the seed layer may be diffused typically in the copper layer.

In order to suppress a parasitic capacitance of a wiring, the interlayer dielectric film is preferably formed with materials with a low dielectric constant. For example, as a CVD low dielectric constant film, the following materials have been used. The materials include hydrogenated silicon oxycarbide (SiCOH) such as Aurora™ of ASM International NV, Black Diamond™ of Applied Materials, and CORAL™ of Novellus Systems and an organic coating film, SilK™, and a porous material such as porous silica. These materials have properties that easily permeate water content. When water content reaches a barrier metal film, oxidization etc. may be caused, thereby the barrier metal layer may be altered, and the barrier property may be lost.

According to M. Haneda et al., "Self-Restored Barrier using Cu—Mn alloy", AMC 2007, pp.27-28 and H. Kudo et al., "Further Enhancement of Electro-migration Resistance by Combination of Self-aligned Barrier and Copper Wiring Encapsulation Techniques for 32-nm Nodes and Beyond", IITC 2008, pp. 117-119, the inventors reported that a dual damascene structure in 45 nm generation is used to fabricate a semiconductor device to which a Cu—Mn alloy seed layer is applied over a Ta barrier metal film, and even when the barrier metal film is thin, the barrier property is self-restored by the additional element Mn of the alloy. Hence, reliability of the copper wiring is improved. According to M. Haneda and H. Kudo, an element mapping in the wiring of the self-restored barrier layer that is formed when heat treatment is applied to a sample of the wiring structure for 30 minutes at 350 degrees Celsius may be referred to.

A self-restored response of the barrier by Mn occurs when heat of 200 to 400 degree Celsius is applied, and heat that is applied in a subsequent manufacturing process, for example, the temperature when forming a cap film by CVD after forming a conductive unit may be utilized. Accordingly, the self-restored barrier layer is easily formed without applying heat separately.

A. Isobayashi et al., "Thermally Robust Cu Interconnects with Cu—Ag Alloy for sub 45 nm Node", IEEE IEDM 04, 2004, pp.953-956, describes forming a copper layer using a Cu—Ag alloy obtained by doping Ag to Cu which suppresses generation of voids due to stress migration and improves reliability.

SUMMARY

According to aspects of embodiments, a semiconductor device manufacturing method includes forming an interlayer dielectric film above a semiconductor substrate; forming a first wiring trench with a first width and a second wiring trench with a second width that is larger than the first width in the interlayer dielectric film; forming a first seed layer that includes a first additional element in the first wiring trench and the second wiring trench; forming a first copper layer over the first seed layer; removing the first copper layer and the first seed layer in the second wiring trench while leaving the first copper layer and the first seed layer in the first wiring trench; forming a second seed layer in the second wiring trench after removing the first copper layer and the first seed layer in the second wiring trench; and forming a second copper layer over the second seed layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 33 are sectional views illustrating processes before forming a copper wiring in the method to manufacture the semiconductor device according to the embodiment;

FIG. 5 is a sectional view schematically illustrating an enlarged configuration of a dual damascene wiring in the method to manufacture the semiconductor device according to the embodiment.

DESCRIPTION OF EMBODIMENTS

Figure 1A:
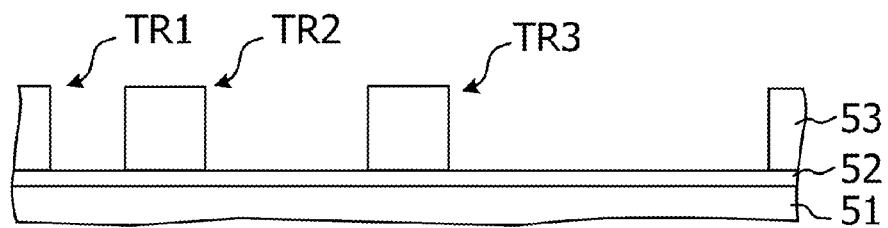
FIGS. 1A to 1E are sectional views schematically illustrating processes for plating a damascene copper wiring layer in wiring trenches with different widths.

Preferred embodiments will be explained with reference to accompanying drawings.

In creating a damascene wiring, a wiring trench is formed in an insulating film. A depth of the wiring trench is substantially constant regardless of a wiring width, and an area of a side wall per unit length of a long wiring is substantially constant regardless of a wiring width. A bottom area increases as a wiring width increases. Accordingly, regardless of whether an alloy seed layer is formed by sputtering with directivity process, or Chemical Vapor Deposition (CVD) process that is conformal, influence of a side wall is expected to be larger in a thin-width wiring compared with that of a large-width wiring.

An amount of the seed layer over the bottom is proportional to a wiring width when the seed layer is formed in a wiring trench with a substantially uniform thickness by the CVD that is conformal film formation. Amount of the seed layer over the side wall is substantially constant regardless of a wiring width. When an additional element in the seed layer over the side wall is redistributed to the entire wiring; a concentration of the additional element of the wiring in the thin-width wiring trench becomes higher than that in the large-width wiring trench.

Sputtering is a film formation method with directivity, and basically, a deposition amount over a flat surface per area may be substantially constant. When a barrier metal film and a seed layer are formed by sputtering, materials reaching a trench opening with a certain angular distribution deposit and distribute over sides and a bottom of the trench. The amount of materials reaching is considered to be proportional to an area of the opening (in other words, a wiring width). In the thin-width wiring trench, incidence angles to the sides and the bottom may be limited depending on the opening width. Accordingly, the seed layer formed in the thin-width wiring trench is thinner than the seed layer formed in the large-width wiring.

The inventors formed a copper wiring evaluation sample in the following manner. A Cu alloy seed layer is formed by sputtering, and a copper layer is formed thereover by electrolytic plating, heat treatment and polishing are applied, and a cap layer is formed. Resistivity of the sample is measured and a difference when no additional element is applied to the seed layer is reviewed. It is revealed that when a width of a wiring is larger, increase rate of resistance becomes higher.

It is assumed that a concentration of elements added to the seed layer is higher in the large-width wiring compared with that in the thin-width wiring. Based on the above described phenomenon, The phenomenon may not be understood considering that the additional elements simply diffuse over the entire wiring.

It is revealed that in a copper wiring obtained by forming a Ta barrier metal film in the wiring trench, a Cu—Mn alloy seed layer thereover and by plating the copper layer, even if the Ta barrier metal in the sides are oxidized by moisture content, the barrier function is recovered when the additional element Mn bonds to oxide. The above described consumption of the additional element occurs preferentially at a side where oxidization of the barrier film is likely to occur, in particular, a side with a minute wiring. Considering the additional element is consumed at the side wall, influence of the side wall is larger for the thinner-width wiring. Thus, when an amount of the element that enables an increase in EM resistivity in the thin-width wiring is added to the seed layer, thereby satisfying requirements of the thin-width wiring, resistivity increases because a consumption amount at the side walls are relatively small in the large-width wiring. Thus, it may be understood that the concentration of the additional element becomes high thereby increasing the resistivity.

The above described phenomenon is considered to be unavoidable when trenches with different widths for a thin-width wiring and a large-width wiring are formed with common processes and a barrier metal film and a seed alloy layer are deposited to form a copper layer and unnecessary portions are removed to form a wiring. However, an increase in resistivity of the wiring needs to be avoided in anyway from a viewpoint of achieving the performance of the device. In the first place, electromigration that becomes a problem for a thin-width wiring is not a big problem in a large-width wiring. In the large-width wiring, stress migration may be a problem.

The above described problem may be solved if types and concentration of additional elements may be freely selected for the thin-width wiring and the large-width wiring. However, manufacturing the thin-width wiring and the large-width wiring in completely different processes increases the number of processes and may thereby reduce a yield. Countermeasures are reviewed in which at least, a recessed portion for burying a wiring is manufactured by common processes and additional processes cause less damage, thereby suppressing yield reduction. Copper electroplating liquid is obtained by adding additives to cupric sulfate solution, for example, chlorine ions, and three types of organic additives; an accelerator to promote plating, a suppressor to suppress copper deposition, and a leveler to suppress copper deposition and provide smoothness. By adding additives, deposition and growth of copper plating are controlled, thereby enabling the filling of a minute via or a wiring trench. In order to perform electroplating, a seed layer that becomes an electrode needs to be formed beforehand. FIGS. 1A to 1D are sectional views schematically illustrating processes for plating a copper wiring layer in wiring trenches.

As illustrated in FIG. 1A, a second insulating film 53 that functions as an interlayer dielectric film is laminated above a base substrate 51 that includes a first insulating film 52 functioning as an insulating copper diffusion preventing film or an etch stopper. Wiring trenches TR1, TR2, and TR3 (at times, collectively called TR) are etched over the second insulating film 53 using a photoresist pattern etc. as an etching mask and the etching mask is removed. A ratio of a height to a width of the trench TR1 (aspect ratio) is assumed to be 1, that of the trench TR2 is assumed to be 0.5, and that of the trench TR3 is assumed to be 0.25.

Figure 1B:
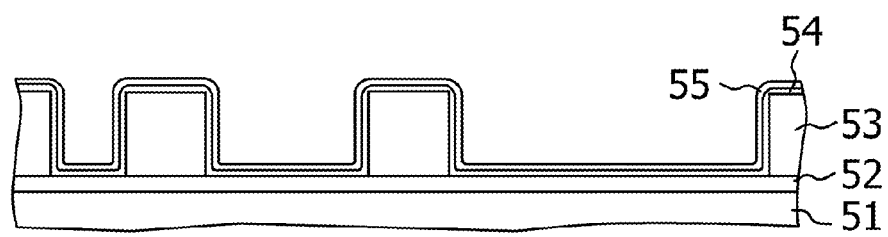

As illustrated in FIG. 1B, for example, a Ta barrier metal film 54 and a Cu—Mn alloy seed layer 55 are deposited by sputtering from above the trench so as to cover an inner surface of the trenches TR. The barrier metal film 54 and the seed layer 55 are formed over an upper surface of the second insulating film 53. The barrier metal film 54 functions to reduce, if not prevent diffusion of copper and elements other than Ta. For example, the barrier metal film 54 is formed by a metal film of TaN, TiN, or Ti or by laminating the metal films. The seed layer 55 becomes an electrode for applying current when plating copper and is formed with copper or a copper alloy. In the case of the copper alloy, for example, an additional element of Mn may be selected from elements that have a function to suppress electromigration in copper wirings.

Figure 1C:
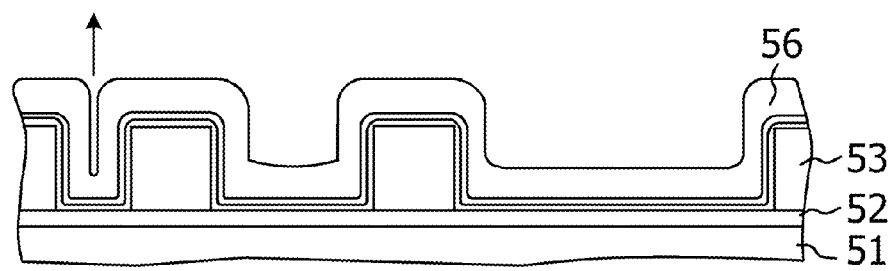

As illustrated in FIG. 1C, a copper layer 56 is plated over the seed layer 55 by electrolytic plating. At the beginning, a plating layer is (conformally) grown over the seed layer at the bottom of and the sides of the trench with a substantially uniform thickness. When an interval between plated copper layers 56 that are grown over opposing sidewalls in the trench become narrower than a certain width, a bottom-up growth in which a plating layer is rapidly grown from a bottom of the remaining narrow trench toward the upper part may be caused. In FIG. 1C, a bottom up growth occurs in the trench TR1.

Figure 1D:
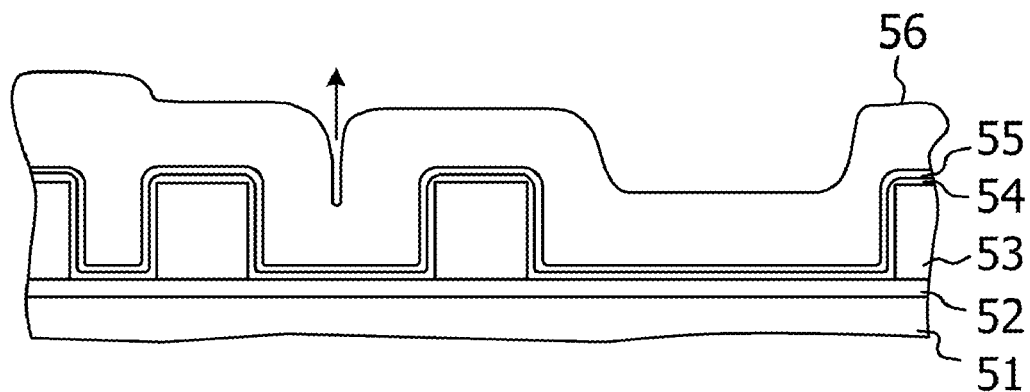

As illustrated in FIG. 1D, when electroplating is further developed, the copper layer above the upper part of the wiring is further grown due to influence of the accelerator and thereby overplating occurs in which the film is relatively swollen. In the trench TR2, a width between plated copper layers over opposing side walls becomes narrower than a certain width before the trench is buried; thereby a bottom-up growth occurs. In the trench TR3, distances between plated copper layer over sidewalls are away from each other, thus conformal growth continues, and no bottom-up growth occurs until the trench is filled. The bottom-up growth and overplating are controlled by adjusting three types of additives to plating liquid.

Figure 1E:
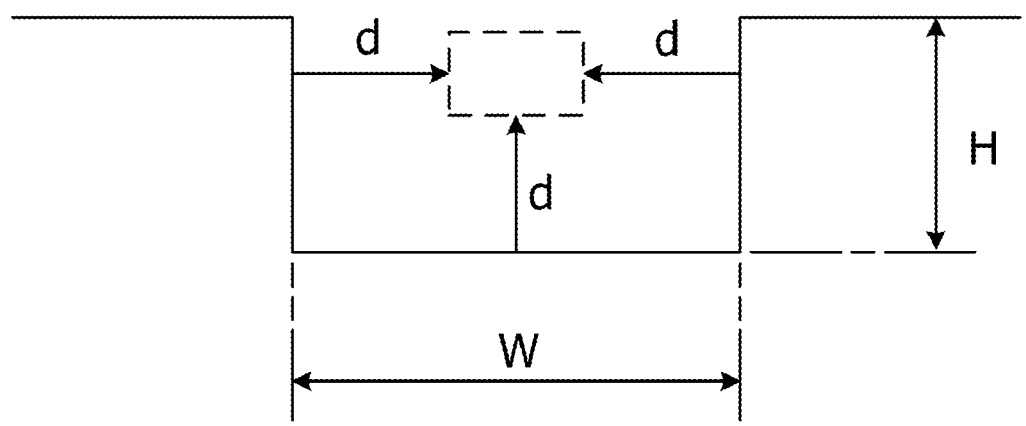

As illustrated in FIG. 1E, a trench depth is assumed to be H, and a trench width is assumed to be W. When a thickness of a composite wiring layer that includes a barrier metal film, a seed layer, and a plated copper layer is substantially uniform d, in order for copper layers over both of the side walls to contact before the copper layer over the bottom fills the trench depth H; the following expression may be satisfied: $d<H$ and $2d=W$, $d=W/2$. In other words, $H>d=W/2$ and the trench depth H is desired to be larger than a half of the trench width W. An aspect ratio of 0.5 may be a critical point whether a bottom-up growth occurs or not before the trench is filled.

Hence, a wiring with an aspect ratio of 0.5 or less is called a large-width wiring while a wiring with an aspect ratio of 0.5 or more is called a thin-width wiring.

FIGS. 2A to 2B and FIGS. 2D to 2G are sectional views illustrating major processes to manufacture a semiconductor device according to a basic embodiment. Two types of thin-width wirings and one type of a large-width wiring are illustrated.

Figure 2A:
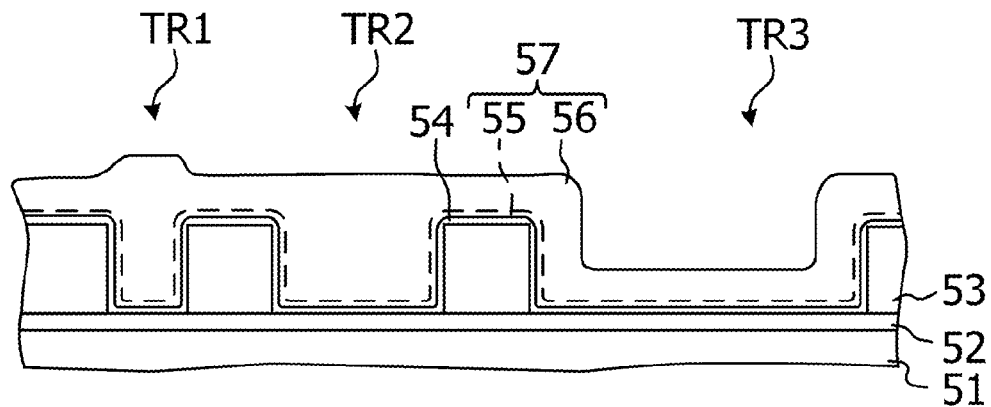
FIGS. 2A to 2B and FIGS. 2D to 2G are sectional views illustrating processes of a method to manufacture a semiconductor device according to an embodiment.

In FIG. 2A, the first insulating film 52 and the second insulating film 53 are laminated over the base substrate 51 and the wiring trenches TR1, TR2, and TR3 are formed over the second insulating film 53. The trenches TR1 and TR2 are assumed to be thin-width trenches while the trench TR3 is assumed to be a large-width trench. The barrier metal film 54 and the seed layer 55 are formed by covering an inner surface of the trench TR. The copper layer 56 is plated over the seed layer 55. In the state of FIG. 2A, filling the thin-width trenches TR1 and TR2 is completed. Overplating occurs in which the film is relatively swollen after filling the trenches because the copper layer of the upper part of the wiring is further grown due to influence of the plating accelerator. A conformal growth continues in the large width trench TR3. The seed layer 55 is a copper or copper alloy layer. Thus, the seed layer 55 and the copper layer 56 are collectively called a copper layer 57.

Figure 2B:
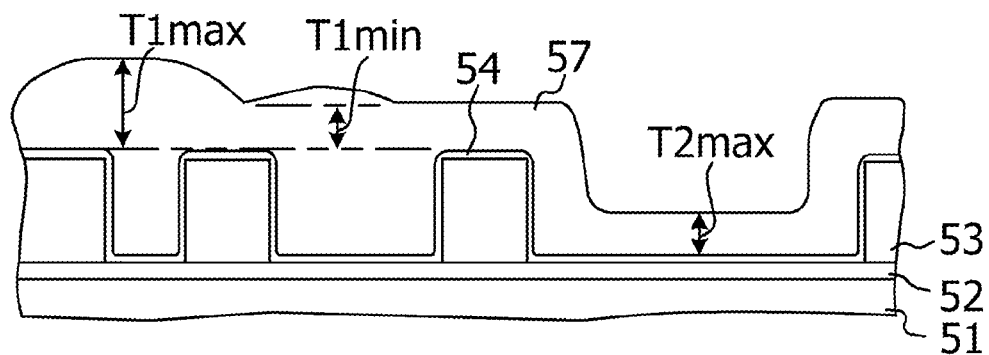

FIG. 2B illustrates a state in which overplating is further developed. A thickness of the copper layer 57 above the second insulating layer 53 is assumed to be T1, while a thickness of the copper layer 57 in the large-width trench is assumed to be T2 and substantially minimum and maximum values are indicated by subscripts, min and max. A thickness of the copper layer 57 over the trench TR1 is T1 max while a thickness of the copper layer 57 over the trench TR2 is assumed to be T1 min, and a thickness of the copper layer from the bottom in the large-width trench TR3 is assumed to be T2 max.

Figure 2C:
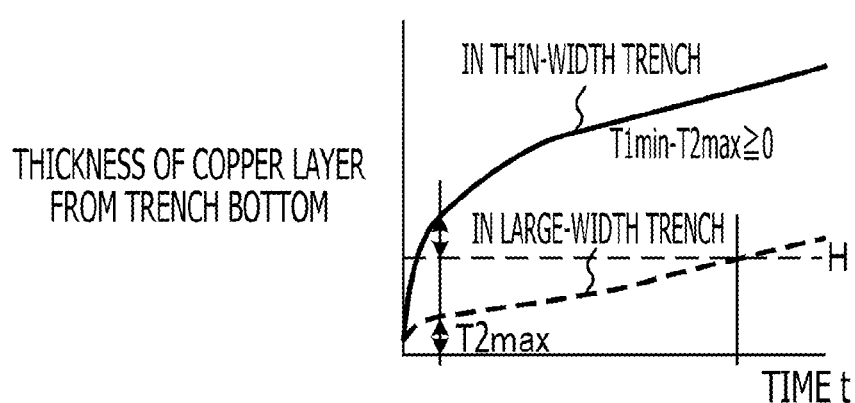
FIG. 2C is a graph illustrating change in thickness of a copper layer with time.

FIG. 2C is a graph illustrating change in thickness of the copper layer with time. The horizontal axis indicates time t, while the vertical axis indicates a thickness of the copper layer from the bottom of the trench. The solid line indicates a thickness of the copper layer 57 in the thin-width wiring, while the dashed line indicates a thickness of the copper layer in the large-width wiring trench. The trench depth H is indicated by the dashed line. When the thickness of the copper layer reaches the trench depth H, filling the trench is completed. The thickness of the copper layer 57 in the thin-width trench higher than the trench depth H indicates a thickness of the copper layer formed relatively swollen due to influence of overplating. A substantially minimum thickness T1 min of the copper layer 57 over the thin-width trench and a substantially maximum thickness T2 max of the copper layer 57 in the large-width trench will be described. After completing filling the thin-width trench, swelling due to influence of overplating occurs and the substantially minimum swelling thickness T1min increases as well, thereby the T1 min exceeds T2 max. The plating completes at a state of T1 min−T2 max>=0. Hereinafter, the seed layer 55 is called a first seed layer and the copper layer 56 is called a first copper layer.

Figure 2D:
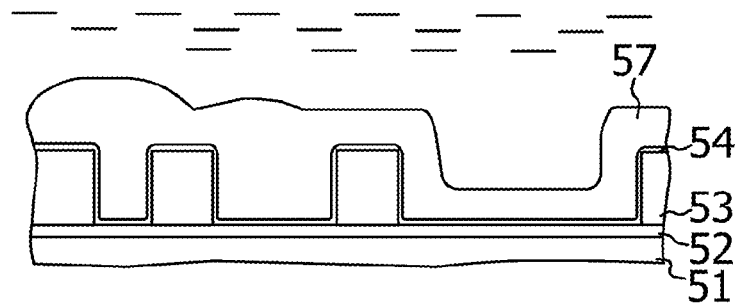

As illustrated in FIG. 2D, the substrate is immersed in etching liquid to etch the copper layer 57. The etching progresses substantially uniformly. The copper layer 57 (the first copper layer 56 and the first seed layer 55) in the large-width trench is substantially completely removed (etched for the amount of T2 max). In this state, even if the thickness of the copper layer 57 over the thin-width trench decreases for the amount of T2max, T1 min−T2 max>=0. Thus, the surface is substantially equal to or higher than the trench and a state in which the trench is filled is maintained.

Figure 2E:
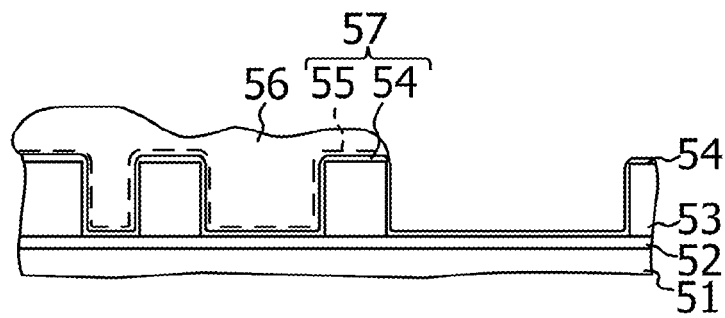

FIG. 2E illustrates a state in which the thin-width trench is filled with the copper layer 57, and the copper layer 57 (in other words, the first copper layer 56 and the first seed layer 55) in the large-width trench is completely removed. The barrier metal layer 54 remains.

Figure 2F:
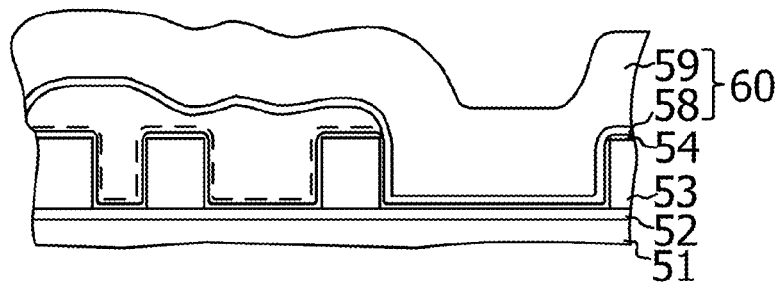

As illustrated in FIG. 2F, a copper alloy second seed layer 58 is newly deposited with the barrier metal layer 54 being exposed in the large-width trench, and a second copper layer 59 is plated thereover. The second seed layer 58 is a layer different from the first seed layer 55 and the composition may be freely selected. A copper alloy to which an appropriate amount of elements suitable for the large-width wiring is added or pure copper may be used for the second seed layer 58. The second seed layer 58 and the second copper layer 59 are collectively called a copper layer 60.

Figure 2G:
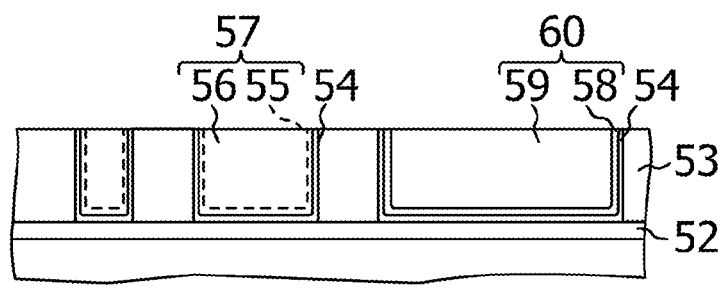

As illustrated in FIG. 2G, after completing plating by filling the large-width trench with the second copper layer 59, heat treatment is applied for crystal stabilization and unnecessary metal layers over the interlayer dielectric film 53 are removed by chemical mechanical polishing (CMP). A conventional method may be used for heat treatment for crystal stabilization. In the large-width wiring trench TR3, the seed layer 58 the composition of which is different from the compositions in the thin-width wiring trenches TR1 and TR2 is filled. The additional element sufficiently diffuses in the copper layer when heat of 300 degree Celsius or more is applied to the additional element in the seed layer at a later process, thereby the copper layer 57 of the thin-width wiring and the copper layer 60 of the large-width wiring have different compositions. Accordingly, the copper wirings with different additional elements may be formed in the thin-width wiring and the large-width wiring.

Diffusion of the additional elements in the seed layers 55 and 58 may be performed by utilizing heat at a later process or by adding a separate heat treatment process. For example, utilizing heat application in the later process may include a temperature when forming an insulating copper diffusion preventing film (an upper cap layer, or an etch stopper film ES2 described later in FIG. 4J), for example, of 400 degree Celsius.

In diffusion of additional elements in the seed layers 55 and 58, for example, an additional element such as Mn reacts, for instance, at an interface of an oxidized barrier metal layer 54 and an interface of an oxidized upper cap film to form a new chemical compounds layer with a diffusion prevention function, the thin-width wiring copper layer 57 and the large-width wiring copper layer 60 have different barrier film compositions respectively. Accordingly, copper wirings that include barrier film composition layers with different metal elements or compositions for the thin-width wiring and the large-width wiring may be formed.

Controlling diffusion of the additional elements of the seed layers 55 and 58 typically to the copper layer by using the additional elements that react with the oxidized barrier metal film within a certain performance allowable range (for example, wiring resistance and reliability) determined by a user may be achieved by the following manner. That is forming the barrier metal layer 54 with a film thickness so as not to be lost by oxidization from the insulating film 53 or by using an insulating film 53 that is less likely to cause oxidization of the barrier metal layer.

Controlling diffusion of the additional elements of the seed layers 55 and 58 to the interface of the barrier metal layer 54 and the copper layer 57 (or barrier metal layer 54 and a copper layer 60) may be achieved by the following manner. That is to increase an amount of the additional elements by increasing a target concentration or forming the barrier metal layer 54 with a thin film, or using an insulating film 53 that easily cause oxidization of the barrier metal layer 54.

Hereinafter, a method to manufacture a semiconductor device according to a more specific embodiment will be described.

Figure 3A:
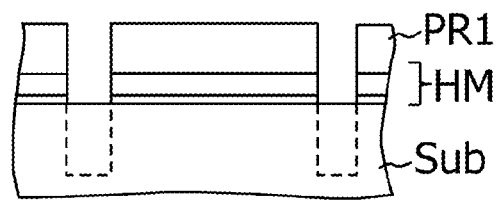

As illustrated in FIG. 3A, for example, a hard mask layer obtained by laminating an oxide film and a nitride film is deposited over a surface of a silicon substrate Sub by CVD and a photo resist mask PR1 that defines a trench for isolating an element is formed over the surface of the hard mask layer. A hard mask HM is formed by etching the hard mask layer using the photoresist mask PR1 as a mask. The photoresist mask PR1 is removed as required and the silicon substrate Sub is etched using the hard mask HM as an etching mask to form an element isolation trench.

Figure 3B:
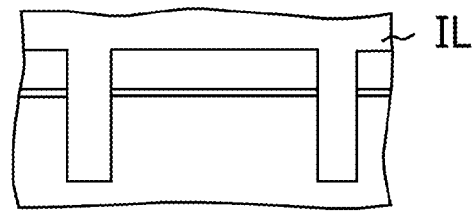

As illustrated in FIG. 3B, after thermally oxidizing a surface of the formed trench, a silicon oxide film IL is deposited by high density plasma (HDP) CVD. The silicon oxide film IL fills the element isolation trench.

Figure 3C:
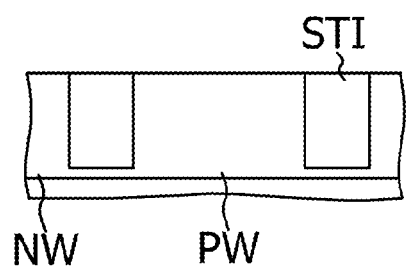

As illustrated in FIG. 3C, the oxide silicon layer IL above the hard mask HM is removed by chemical mechanical polishing (CMP). After that, the hard mask HM is removed as well. Accordingly, a shallow trench isolation type element isolation region STI is formed. The element isolation region STI defines an active region. A through oxide film is formed over a surface of the active region and a p-type well PW and an n-type well NW are formed by dividing a transistor region into an n channel (NMOS) transistor region and a p-channel (PMOS) transistor region by a resist mask and by applying ion implantation. After that, the through oxide film is removed. As an example, an nMOS transistor that operates at 1.2 V will be described below.

Figure 3D:
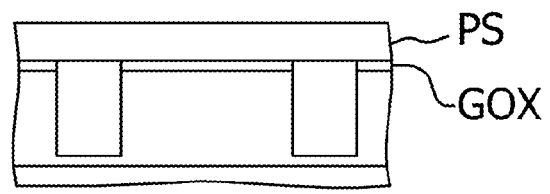

As illustrated in FIG. 3D, the surface of the active region is thermally oxidized to form a gate oxide film Gox with a thickness of 1.3 mm. A non-doped polycrystalline silicon layer PS is deposited over the gate oxide film Gox with a thickness of about 100 nm CVD.

Figure 3E:
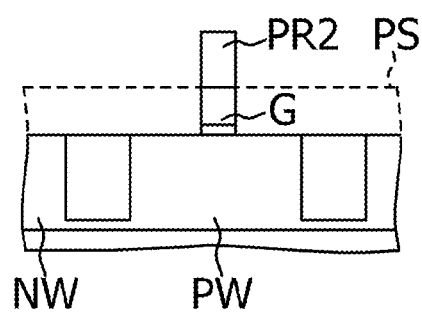

As illustrated in FIG. 3E, a photoresist pattern PR2 is formed over the polycrystalline silicon layer PS, and the polycrystalline silicon layer PS is patterned by anisotropic dry-etching of reactive ion etching. A gate electrode G is formed over each of the active regions. The photoresist pattern PR2 is removed.

Figure 3F:
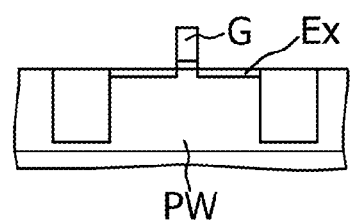

As illustrated in FIG. 3F, ion implantation for forming an extension region is carried out using the gate electrode G as a mask. An n-MOS transistor region and a p-MOS transistor region are separated by a resist mask, and for example, ion implantation of As+ to the n-MOS region and B+ to the p-MOS region are carried out. Extension regions Ex are formed at both sides of the gate electrode G.

Figure 3G:
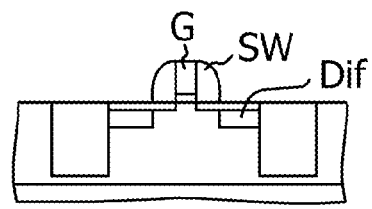

As illustrated in FIG. 3G, an oxide silicon film with a thickness of 10 nm is deposited over a whole surface of the substrate by CVD, the oxide silicon film over a flat surface is removed by anisotropic dry etching, and sidewall spacers SW are left over side walls of the gate electrode. A low resistance source drain diffusion layer Dif is ion implanted using the gate electrode G and sidewall spacers SW as masks. The nMOS transistor region and the pMOS transistor region are separated by the resist mask. For example, ion implantation of P+ to the n-MOS region, and B+ to the p-MOS region are carried out. The ion implanted impurities are activated, for example, by applying rapid thermal annealing.

Figure 3H:
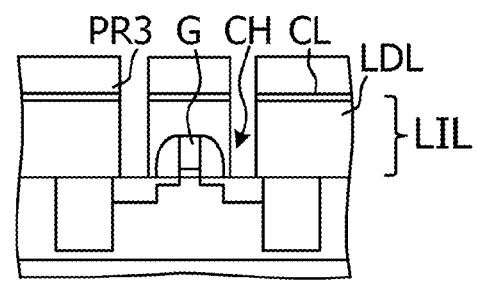

As illustrated in FIG. 3H, a lower interlayer insulating film LIL is formed by depositing an oxide silicon film with a thickness of 180 nm as a lower insulating film LDL and a SiC film with a thickness of 30 nm as a cap layer CL by CVD over the silicon substrate by covering the gate electrode G. A contact hole CH is etched over the lower interlayer insulating film LIL using the photoresist mask PR3 as an etching mask. A low resistance source drain diffusion layer Dif is exposed at a bottom of the contact hole CH. The photoresist mask PR3 is removed.

Figure 3I:
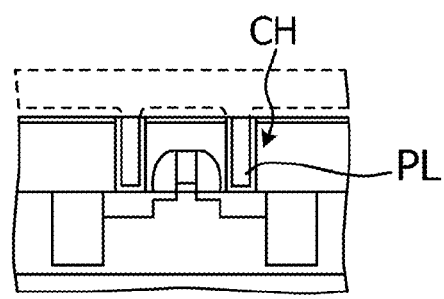

As illustrated in FIG. 3I, a TiN layer with a thickness of 3 nm is formed by atomic layer deposition (ALD) and a W layer with a thickness of 180 nm is deposited by CVD to fill the contact hole CH. Unnecessary metal layers over the lower interlayer insulating film LIL are removed by CMP and a conductive plug PL is left in the contact hole CH.

Figure 3J:
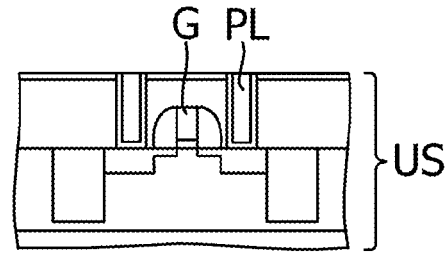

FIG. 3J illustrates a lower structure US formed as described above. The processes described above are known and may be replaced with other known processes and structures. In the description below, the lower structure US is simplified.

An embodiment to form a damascene wiring over a lower structure will be described below. A single damascene first copper line is formed over a W plug and a dual damascene second copper wiring is formed thereover. Both the first copper wiring and the second copper wiring include a thin-width wiring and a large-width wiring respectively.

Figure 4A:
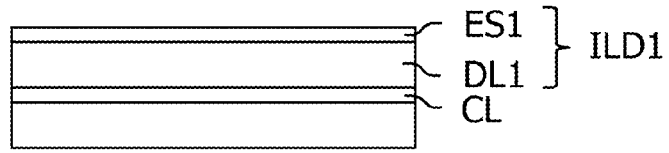
FIGS. 4A to 4S are sectional views illustrating the processes to form the copper wiring in the method to manufacture the semiconductor device according to the embodiment.

As illustrated in FIG. 4A, an insulating film DL1 is formed over a lower structure US that includes a cap layer CL. For example, a SiOC film with a thickness of 220 nm is deposited by CVD. As an insulating film, a SiO film made of tetraethoxysilane (TEOS) or silane gas and formed by plasma-promoted (PE) CVD or thermal CVD may be used. In order to reduce a parasitic capacitance of a wiring, it is desirable to use an insulating film with dielectric constant lower than that of the oxide silicon. As an inorganic film with a low dielectric constant, for example, a SiOC film made of organosilane-base material, a film made of organosiloxane-base material, a film made of hydrogenerated siloxane-base material, and a nano-clustering silica film made of a porous silica base material may be used. An etch stopper layer ES1 is formed over the insulating film DL1. For example, a SiC film with a thickness of 30 nm is deposited at temperature of 300 to 450 degree Celsius, for example, 400 degree Celsius by plasma-enhanced chemical vapor deposition (PECVD) using tetramethylsilane as a material. As an etch stopper layer, for example, a SiC film and a SiN film deposited by PECVD may be used.

A first inter-layer dielectric film ILD1 is made up of a lamination of the insulating film DL1 and the etch stopper layer ES1. The highest layer in the lower structure is a SiC cap layer CL and a W plug locally penetrates. As an insulating film with low dielectric constant, for example, an organic coating film of SiLK or a porous silica film may be used instead of the SiOC film.

Figure 4B:
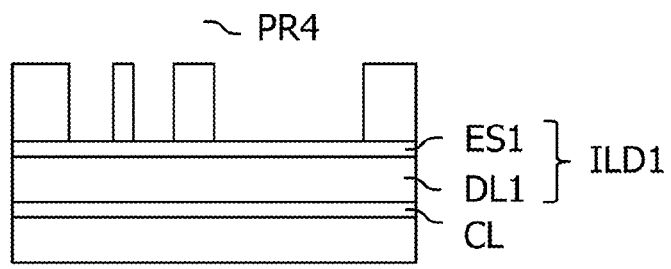

As illustrated in FIG. 4B, a wiring trench is etched over the first inter-layer dielectric film ILD1 (ES1+DL1) using a photoresist mask PR4 as an etching mask. A conductive plug is exposed at a bottom of the wiring trench. The left wiring trench is a thin-width trench. The center and right wiring trenches are large-width trenches. The width of the wiring trench is for example, 50 nm to 30,000 nm. The photoresist mask PR4 is removed.

Figure 4C:
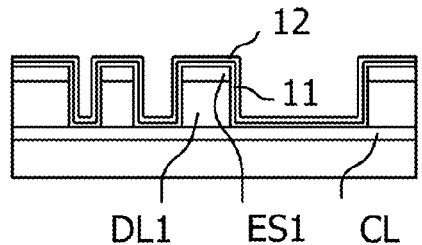

As illustrated in FIG. 4C, a Ta film with a thickness of 5 nm is formed, for example, by sputtering (PVD, physical vapor deposition) as a barrier metal film 11 so as to cover an inner wall of the wiring trench. For example, the film is formed by sputtering using a Ta target and discharge gas, Ar or $N_2$ by applying power of 160 mW/mm$^2$ to 640 mW/mm$^2$ to the target. Instead of the Ta film, a laminated layer of Ta/TaN or a Ti film may be used. The film thickness may be 1 nm to 15 nm. ALD may be used instead of PVD.

A Cu—Mn alloy film as a seed layer 12 for plating is formed over the barrier metal film 11, for example, by a thickness of 35 nm PVD. For example, sputtering is performed by using a Cu—Mn alloy target and by applying power of DC 10 kW in $10^{-1}$ Pa Ar atmosphere. The additional element Mn of the copper alloy film is for suppressing electromigration in the thin-width wiring. Besides the Cu—Mn alloy, a Cu alloy obtained by mixing Cu with one of Al, Ti, or Sn, or by mixing Cu with two or more of Mn, Al, Ti, and Sn may be used.

Figure 4D:
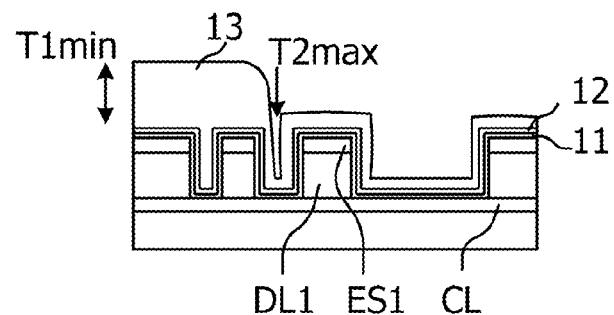

As illustrated in FIG. 4D, a copper layer 13 is plated over the seed layer 12 by electrolytic plating. For example, a set of copper sulfate basic bath and additives of VIA FORM (™) NEXT available from Enthone Inc. may be used. Electroplating is applied at current density of 13.5 mA/cm2 for 2.5 seconds and at current density of 8.3 mA/cm2 for 20 seconds, using plating liquid that includes an accelerator of 6 mL/L to 12 mL/L, for example, 10 mL/L, a suppressor of 1 mL/L to 5 mL/L, for example, 2 mL/L, and a leveler of 1 mL/L to 5 mL/L, for example, 3 mL/L. The L means liter. A plating thickness in blanket film conversion is about 75 nm.

A film thickness T1 min above the first inter-layer dielectric film ILD1 in the thin-width wiring trench is about 180 nm, and a film thickness T2 max of the copper layer from the bottom of the large width wiring trench is about 110 nm. In the large-width wiring trench, more than a half of the trench depth 250 nm is not filled and the film thickness T2 max of the copper layer from the bottom of the large width wiring trench is smaller than the film thickness T1 min of the copper layer above the inter layer insulating film in the thin-width wiring trench.

As plating liquid, other general-purpose copper plating liquid may be used. For example, VIA FORM (™) of Enthone Inc., Via Form series of VIA FORM EXTREME(™), and ULTRAFILL (™) series of Rohm and Haas company may be used.

Figure 4E:
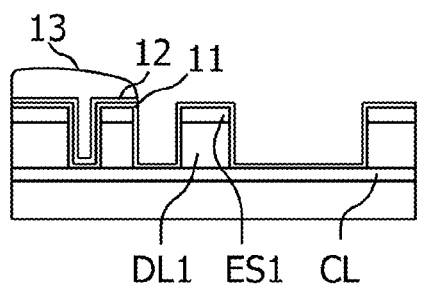

As illustrated in FIG. 4E, a plated copper layer 13 in the large-width wiring trench and a seed layer 12 under the plated copper layer 13 are removed by etching. For example, Cu and the Cu alloy are selectively removed for a thickness of 110 nm for 3.5 seconds using dilute solution of $H_2SO_4$:$H_2O_2$:pure water=2:15:125 (volume ratio). Wet etching may be applied for 2 seconds using dilute solution of HF:$H_2O_2$:pure water=1: 1:200 (volume ratio). The plated copper layer and the copper alloy seed layer under the plated copper layer in the large-width wiring trench are removed. The copper layer in the thin-width wiring trench region is wet-etched; however, the thin-width wiring trench is not exposed.

Figure 4F:
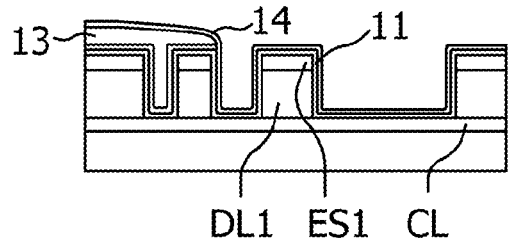

As illustrated in FIG. 4F, a second seed layer 14 is deposited. The second seed layer 14 is, for example, a Cu—Al alloy film with a thickness of 35 nm, and formed by sputtering using a Cu—Al target by applying power of DC 10 kW in $10^{-1}$ Pa Ar atmosphere. The second seed layer 14 is a seed layer for plating a copper wiring in the large-width wiring trench and preferably formed by pure copper or a copper alloy with a function to suppress an increase in wiring resistance while suppressing stress migration. Additional elements for the copper alloy may be one or two or more of Ti, Al, Ag, Sn, or Mn and the additional elements that are different from the additional elements of the first seed layer may be selected. Elements that may satisfy performance desired for the thin-width wiring and the large-width wiring may be added independently from each other with appropriate concentrations. The same elements with different concentrations may be added to the thin-width wiring and the large-width wiring.

Figure 4G:
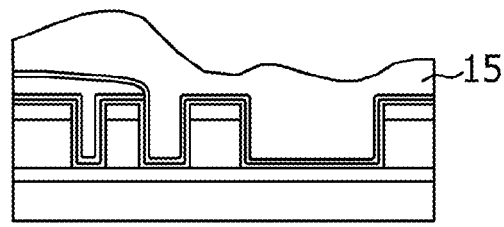

As illustrated in FIG. 4G, copper plating for forming a large-width wiring is applied over the semiconductor substrate where the thin-width wiring trench is filled to form a second copper layer 15. For example, a copper layer with a thickness of 250 nm to 10,000 nm is electroplated at current density of 3 mA/cm$^2$ to 55 mA/cm$^2$, using copper sulfide base solution that includes an accelerator of 3 mL/L to 15 mL/L, for example, 6 mL/L, a suppressor of 1 mL/L to 10 mL/L, for example, 2 mL/L, and a leveler of 1 mL/L to 10 mL/L, for example, 2.5 mL/L. Bottom-up growth and overplating are not required and concentrations of additives are different from those of the plating liquid for the first copper layer 13. In the example, concentration of the accelerator and leveler for the second copper plating are selected to be lower than those for the first copper plating.

Figure 4H:
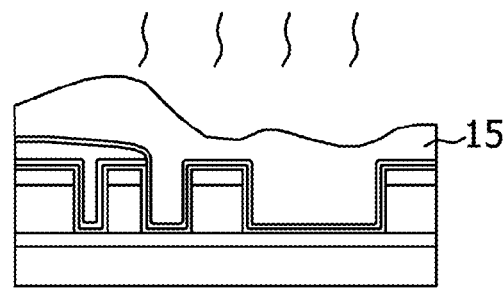

As illustrated in FIG. 4H, heat treatment is applied for crystal stabilization of the formed copper layer. A method substantially the same as a conventional method may be used for the heat treatment. For example, heat treatment may be applied for 90 seconds at 25 degree Celsius in N$_2$/H$_2$ atmosphere.

Figure 4I:
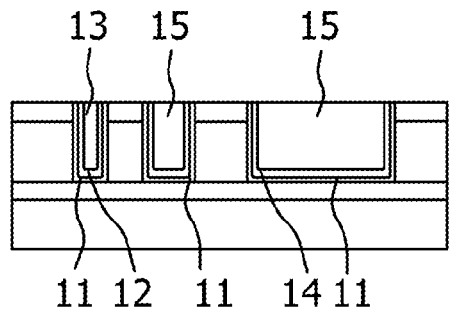

As illustrated in FIG. 4I, CMP is applied to remove unnecessary metal layers over the interlayer dielectric film. A first copper wiring that is typically buried in the wiring trench is formed.

Sufficient heat application over 300 degree Celsius at a subsequent process diffuses the additional element of the first seed layer 12, for example, Mn and the additional element of the second seed layer, for example, Al toward an interface of the barrier metal or the copper wiring. As described above, diffusion of additional elements of the seed layers may be performed by applying heat treatment separately.

Figure 4J:
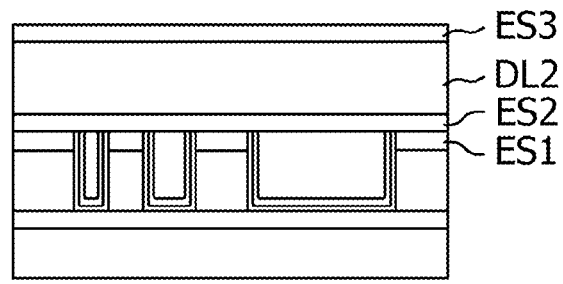

As illustrated in FIG. 4J, a second etch stopper layer ES2, a second low dielectric constant film DL2, and a third etch stopper layer ES3 are formed over the first etch stopper layer ES1 by covering the first copper wiring. The second etch stopper layer ES2 functions as an insulating copper diffusion preventing film (cap layer) for the first copper wiring. For example, a SiC film with a thickness of 30 nm is deposited at 400 degree Celsius, for example, by plasma CVD. Over the SiC film, a SiOC film with a thickness of 300 nm is deposited at the substrate temperature of 400 degree Celsius, for example, by CVD. Moreover, a SiC film with a thickness of 30 nm is deposited.

As an insulating copper diffusion preventing film, SiC film, SiOC film, SiCN film, SiON film and SiN film that are made of organosilane-base material and silane gas may be used. A thickness of a low dielectric constant film may be in a range of 100 nm to 500 nm. Film formation temperature may be in a range of 350 to 400 degree Celcius.

Figure 4K:
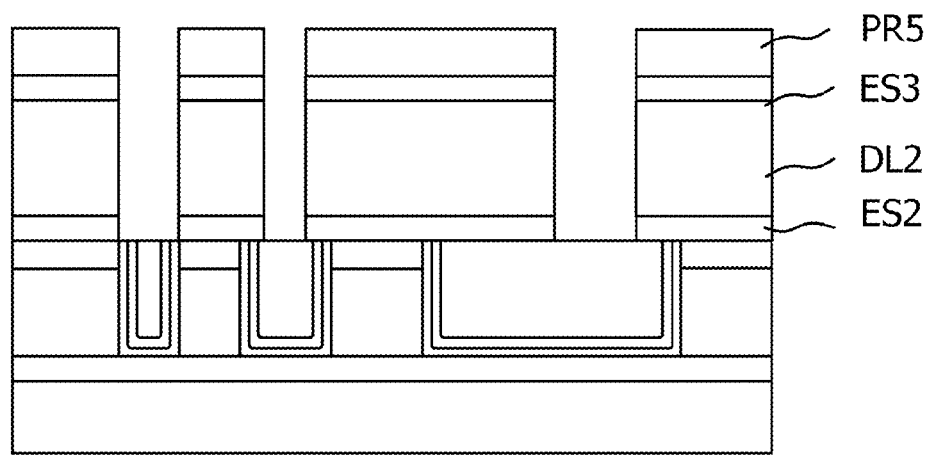

As illustrated in FIG. 4K, the third etch stopper layer ES3, the second low dielectric constant film DL2, and the second etch stopper layer ES2 are etched to form a via hole using a photoresist mask PR5 as an etching mask. A diameter of the via hole is, for example, 70 nm. The photoresist mask PR5 is removed.

Figure 4L:
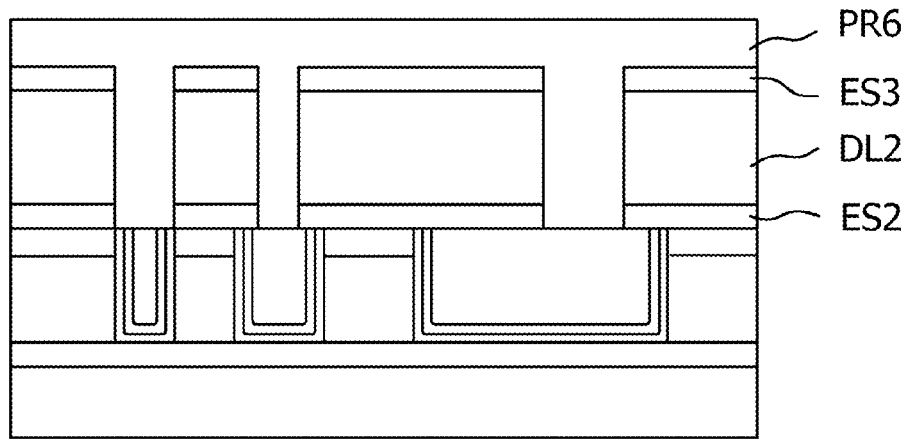

As illustrated in FIG. 4L, the via hole is filled and a photoresist film PR6 is applied over the third etch stopper layer ES3. A pattern for forming wiring trenches is exposed over the photoresist film PR6 and is developed. The photoresist film is left in a deep via hole.

Figure 4M:
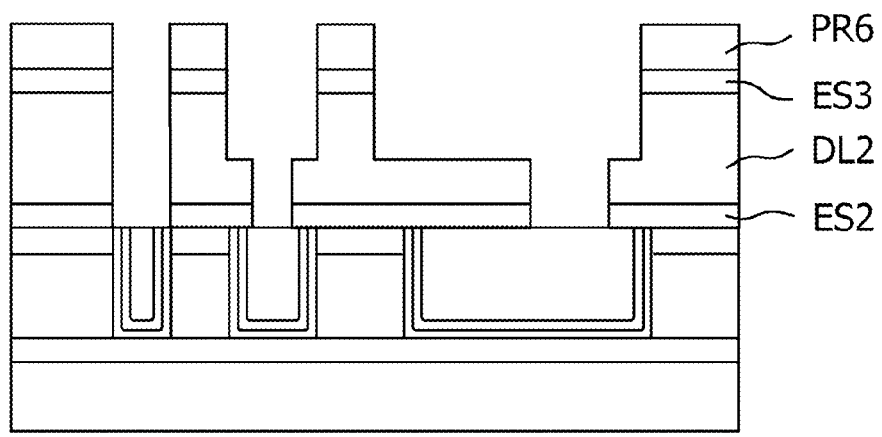

As illustrated in FIG. 4M, the third etch stopper layer ES3 and the second low dielectric constant insulating film DL2 are etched for 150 nm to form a thin-width wiring trench and a large-width wiring trench with a certain width and a height. The photoresist mask PR6 is removed. Here, a via-first in which a wiring trench is formed after forming a via hole is described. However, a via-last in which a via hole is formed after forming a wiring trench may be used.

Figure 4N:
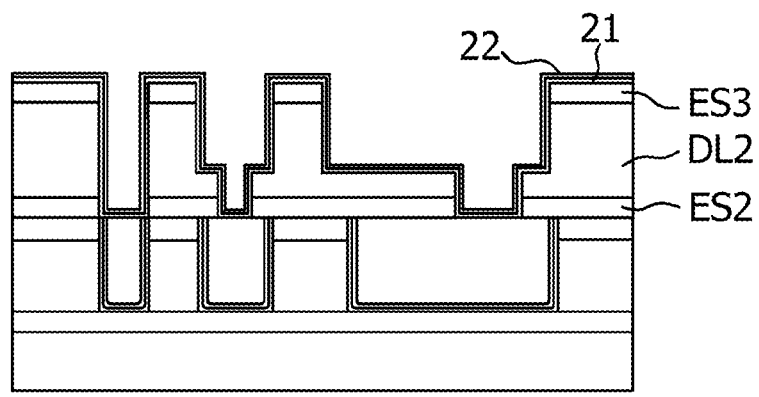

As illustrated in FIG. 4N, a Ta film with a thickness of 5 nm is formed over the interlayer dielectric film in which the wiring trench and the via hole are formed. For example, the Ta film is formed by sputtering a Ta target. A Cu—Mn alloy film with a thickness of 35 nm is formed over the Ta film as a seed layer 22 by sputtering. The processes are substantially the same as the processes illustrated in FIG. 4C. The seed layer 22 is a copper alloy to which elements that may suppress electromigration in the thin-width wiring are added.

Figure 4O:
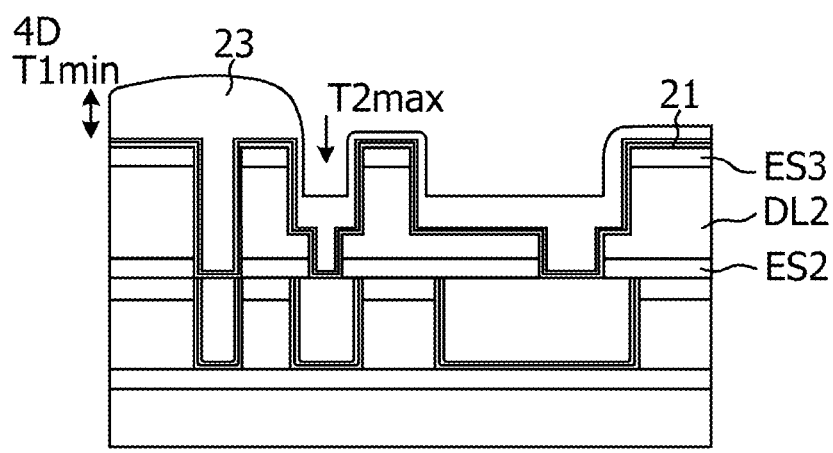

As illustrated in FIG. 4O, a copper layer 23 is electrolytically plated over the seed layer 22. The process is, as in the electrolytic plating in FIG. 4D, performed under a condition in which a bottom-up growth and overplating are likely to occur in the thin-width wiring trench. The via hole is a thin-width trench with an aspect ratio far above 0.5. Bottom-up growth occurs in the via hole and a via conductor is formed. Plating processes in the wiring trench is performed in substantially the same manner as that of the single damascene process illustrated in FIG. 4D. The electrolytic plating is completed when a thickness T1 min of a copper layer above the interlayer dielectric film in the thin-width wiring trench becomes thicker than a thickness T2 max of the copper layer from the bottom of the large-width wiring trench.

Figure 4P:
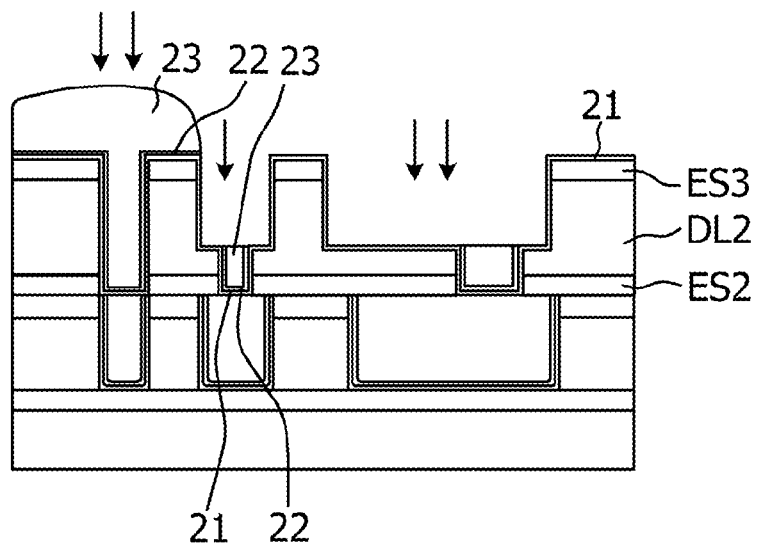

As illustrated in FIG. 4P, the copper layer 23 and the seed layer 22 in the large-width wiring trench are removed by etching the copper layer 23. Accordingly, a state remains in which the copper wiring is buried in the thin-width wiring trench. The process is substantially the same as the process illustrated in FIG. 4E. However, even for the large-width wiring trench, the copper layer 23, and the seed layer 22 are left in the lower via hole.

Figure 4Q:
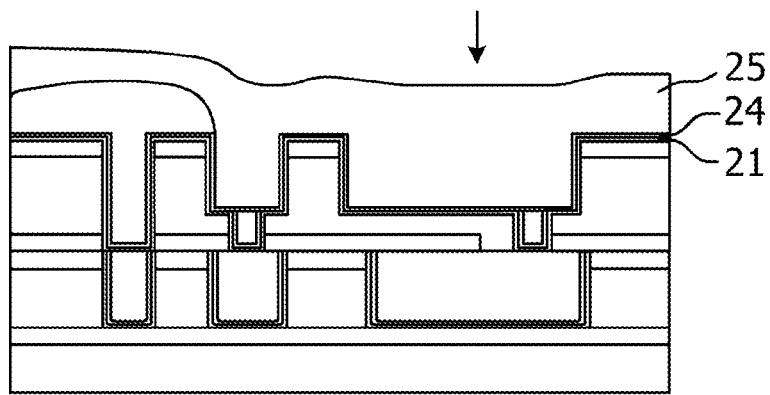

As illustrated in FIG. 4Q, a new seed layer 24 is formed and a new copper plated layer 25 is formed. The processes are substantially the same as the processes illustrated in FIGS. 4F and 4G. The new seed layer is pure copper or a copper alloy that includes an appropriate amount of additives that suppresses an increase in wiring resistance while suppressing stress migration.

Figure 4R:
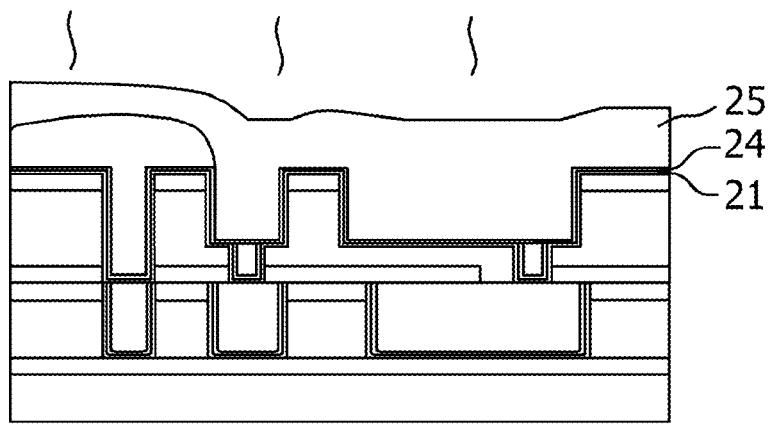

As illustrated in FIG. 4R, heat treatment is applied for stabilizing the copper alloy. The process is substantially the same as the process illustrated in FIG. 4H.

Figure 4S:
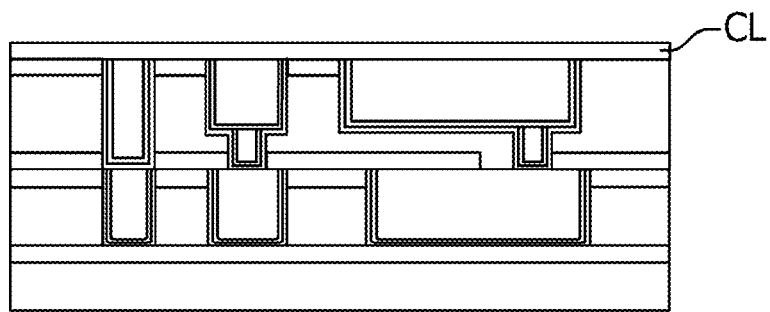

As illustrated in FIG. 4S, unnecessary metal layers over a surface of the interlayer insulating film are removed by CMP. A second copper wiring layer is formed. Sufficient heat application over 300 degree Celsius at subsequent processes diffuses the additional element of the seed layer 22, for example, Mn and the additional element (if any) of the seed layer 24 toward an interface of the barrier metal or a copper wiring. As described above, diffusion of additional elements of the seed layers may be performed by a separate heat treatment process. A SiC layer with a thickness of 30 nm is deposited over a planarized surface in which a copper wiring is exposed as an insulating cap film CL that reduces, if not prevent copper diffusion or an etch stopper layer by CVD at 400 degree Celsius. A multilayer wiring is formed by repeating the copper wiring formation processes as required.

Figure 5:
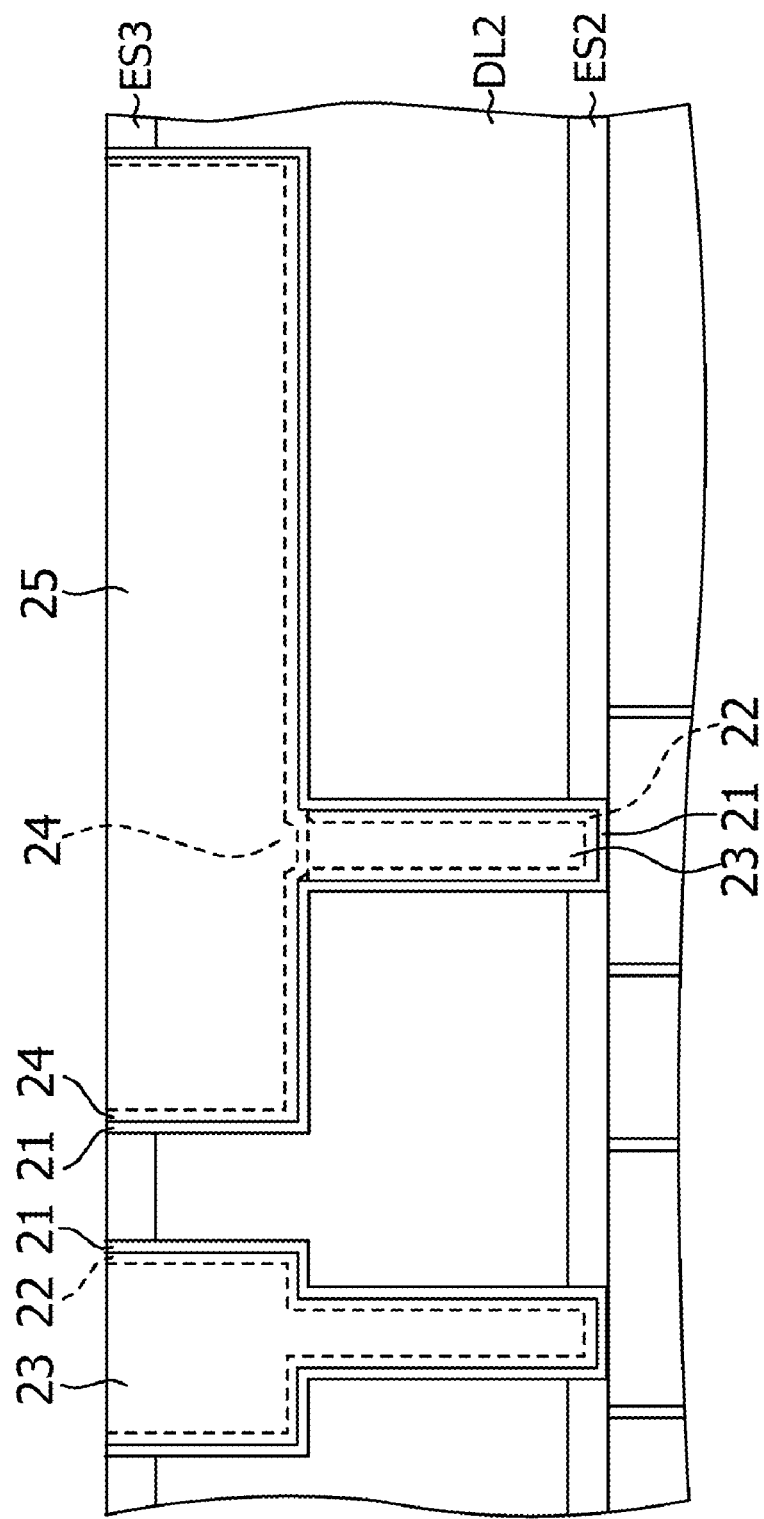

FIG. 5 is a sectional view schematically illustrating a configuration of a dual damascene wiring according to the above described embodiment. The left side indicates a thin-width wiring, while the right side indicates a large-width wiring. A recessed portion for a dual damascene wiring includes a via hole and a wiring trench which is continuous from the upper part of the via hole.

A barrier metal film 21 is formed by covering a whole surface of the recessed portion, and the first seed layer 22 and the first copper layer 23 are formed over the barrier metal film 21. The first copper layer 23 in the large-width wiring trench and the seed layer 22 under the first copper layer 23 are removed. In the via hole, the first seed layer 22 over the barrier metal film 21 and the first copper layer 23 above the first seed layer 22 remain. The second seed layer 24 is formed over the barrier metal film 21 in the large-width wiring trench and the second seed layer 24 is formed over the first copper layer 23 that fills the via hole. The second copper layer 25 is formed over the second seed layer 24. In other words, a large-width dual damascene wiring has a configuration as if single damascene wirings are stacked because of the manufacturing processes. However, no barrier metal film exists over the copper wiring that fills the via hole.

According to the embodiment described above, etching is used for removing copper layers in the large-width wiring as illustrated in FIGS. 4E and 4P. Reverse plating may be used instead of etching. In other words, a polarity of applied voltage is reversed by immersing the substrate in the electrolytic plating liquid and copper in the plated layer is dissolved into the plating liquid thereby reducing a thickness of the copper layer.

Moreover, plating is used for forming a copper layer for wiring. Instead of the plating, physical vapor deposition (PVD) such as sputtering or Chemical Vapor Deposition (CVD) may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A semiconductor device manufacturing method comprising:
    forming an interlayer dielectric film above a semiconductor substrate;
    forming a first wiring trench with a first width and a second wiring trench with a second width that is larger than the first width in the interlayer dielectric film;
    forming a first seed layer that includes a first additional element in the first wiring trench and the second wiring trench;
    forming a first copper layer over the first seed layer;
    removing the first copper layer and the first seed layer in the second wiring trench while leaving the first copper layer and the first seed layer in the first wiring trench;
    forming a second seed layer in the second wiring trench after removing the first copper layer and the first seed layer in the second wiring trench; and
    forming a second copper layer over the second seed layer.

2. The semiconductor device manufacturing method according to claim 1, wherein
    a barrier metal layer is formed in the first wiring trench and the second wiring trench before forming the first seed layer; and
    the barrier metal layer is not removed when the first copper layer and the first seed layer in the second wiring trench are removed.

3. The semiconductor device manufacturing method according to claim 1, wherein the first copper layer is formed by electrolytic plating that includes a bottom-up growth and overplating.

4. The semiconductor device manufacturing method according to claim 3, wherein the electrolytic plating is applied by using a plating liquid that includes an accelerator, a suppressor, and a leveler.

5. The semiconductor device manufacturing method according to claim 3, wherein the first wiring trench has an aspect ratio exceeding 0.5 and the second wiring trench has an aspect ratio of 0.5 or less.

6. The semiconductor device manufacturing method according to claim 3, wherein the first copper layer is formed above the first wiring trench until a thickness of a portion of the first copper layer above the first seed layer and the interlayer insulating film of the first copper layer becomes a thickness of the first seed layer and the first copper layer in the second wiring trench or more.

7. The semiconductor device manufacturing method according to claim 1, wherein
    forming the first wiring trench and the second wiring trench also includes forming a first via hole that is extended downward from a bottom of the first wiring trench and a second via hole that is extended downward from a bottom of the second wiring trench;
    forming the first seed layer includes forming the first seed layer in the first wiring trench, the second wiring trench, the first via hole and the second via hole; and
    removing the first copper layer and the first seed layer in the second wiring trench includes leaving the first copper layer and the first seed layer in the second via hole.

8. The semiconductor device manufacturing method according to claim 1, wherein a wet etching is used for removing the first copper layer and the first seed layer in the second wiring trench.

9. The semiconductor device manufacturing method according to claim 1, wherein a reverse plating is used for removing the first copper layer and the first seed layer in the second wiring trench.

10. The semiconductor device manufacturing method according to claim 1, wherein the interlayer dielectric film includes a laminated layer of an etch stopper layer and a low dielectric constant insulating film, the etch stopper layer includes one of a SiC film, a SiOC film, a SiON film, a SiCN film and a SiN film, and the low dielectric constant insulating film includes one of a SiOC film, an organosiloxane-base material film, a hydrogenated siloxane-base material film, a nano-clustering silica film, and an aromatic polyether film.

11. The semiconductor device manufacturing method according to claim 1, wherein the first additional element is one of Mn, Al, Sn and Ti.

12. The semiconductor device manufacturing method according to claim 11, wherein a concentration of the first additional element in the first seed layer is in a range of 0.5 at % to 10 at %.

13. The semiconductor device manufacturing method according to claim 1, wherein the second seed layer includes a second additional element that is at least one of Mn, Al, Sn, Ti and Ag.

14. The semiconductor device manufacturing method according to claim 13, wherein a concentration of the second additional element is lower than the concentration of the first additional element when the first additional element and the second additional element are the same element.

15. The semiconductor device manufacturing method according to claim 13, wherein the concentration of the second additional element in the second seed layer is within a range of 0.1 at % to 10 at %.

* * * * *